US012795826B2

(12) United States Patent
Kouno et al.

(10) Patent No.: US 12,795,826 B2
(45) Date of Patent: Nov. 10, 2026

(54) CERAMIC WIRING MEMBER

(71) Applicants: NGK ELECTRONICS DEVICES, INC., Mine (JP); NGK INSULATORS, LTD., Nagoya (JP)

(72) Inventors: Hiroshi Kouno, Mine (JP); Atsushi Mase, Mine (JP)

(73) Assignees: NGK ELECTRONICS DEVICES, INC., Mine (JP); NGK INSULATORS, LTD., Nagoya (JP)

( * ) Notice: Subject to any disclaimer, the term of this patent is extended or adjusted under 35 U.S.C. 154(b) by 158 days.

(21) Appl. No.: 18/898,771

(22) Filed: Sep. 27, 2024

(65) Prior Publication Data

US 2025/0024599 A1 Jan. 16, 2025

Related U.S. Application Data

(63) Continuation of application No. PCT/JP2023/013590, filed on Mar. 31, 2023.

(30) Foreign Application Priority Data

Mar. 31, 2022 (WO) .................. PCT/JP2022/016899

(51) Int. Cl.

| | |
|---|---|
| ***H05K 1/09*** | (2006.01) |
| ***H05K 1/02*** | (2006.01) |
| ***H05K 1/03*** | (2006.01) |
| *H05K 1/183* | (2026.01) |

(52) U.S. Cl.

CPC ............. *H05K 1/09* (2013.01); *H05K 1/0298* (2013.01); *H05K 1/0306* (2013.01); *H05K 1/183* (2013.01);

(Continued)

(58) Field of Classification Search

CPC .......... H05K 1/09; H05K 1/092; H05K 1/095; H05K 1/097; H05K 1/0298; H05K 1/0306

See application file for complete search history.

(56) References Cited

U.S. PATENT DOCUMENTS 6,329,065 B1 12/2001 Ishida et al.

FOREIGN PATENT DOCUMENTS

JP 2000-188453 A 7/2000
JP 2003-347710 A 12/2003

(Continued)

OTHER PUBLICATIONS

Japanese Office Action received in corresponding Japanese Application No. 2024-512916 dated Jun. 17, 2025.

(Continued)

*Primary Examiner* — Jeremy C Norris

(74) *Attorney, Agent, or Firm* — MATTINGLY & MALUR, PC

(57) ABSTRACT

A ceramic wiring member includes: a main body portion made of ceramic; and an electroconductive portion arranged in contact with the main body portion. The electroconductive portion has a composition including: a first metal component corresponding to a main component, the first metal component being at least any one of W or Mo; at least one second metal component selected from the group consisting of Ni, Co, and Fe at 0.1% or more and 10% or less in total to the first metal component; and a ceramic component. The electroconductive portion has a structure including: an electroconductive phase made of an alloy of the first metal component and the second metal component; and a glass phase, which is dispersed in the electroconductive (Continued)

phase and is made of the ceramic component at 3% or more and 20% or less in area ratio on a cross section of the electroconductive portion.

14 Claims, 3 Drawing Sheets

(52) U.S. Cl.
CPC ................ *H05K 2201/0209* (2013.01); *H05K 2201/0776* (2013.01)

(56) References Cited

FOREIGN PATENT DOCUMENTS

| | | | |
|---|---|---|---|
| JP | 2009-283510 | A | 12/2009 |
| JP | 2020-92234 | A | 6/2020 |
| JP | 2020-96120 | A | 6/2020 |

OTHER PUBLICATIONS

Japanese Office Action received in corresponding Japanese Application No. 2024-512916 dated Oct. 7, 2025.
International Preliminary Report on Patentability received in corresponding International Application No. PCT/JP2023/013590 dated Oct. 10, 2024.
International Search Report of PCT/JP2023/013590 dated Jun. 20, 2023.
Written Opinion of the International Searching Authority of PCT/JP2023/013590 dated Jun. 20, 2023.

CERAMIC WIRING MEMBER

CROSS-REFERENCE TO RELATED APPLICATION

This application is a continuation application of PCT/JP2023/013590, filed on Mar. 31, 2023, which claims the benefit of priority of Japanese Application No. PCT/2022/016899, filed on Mar. 31, 2022, the entire contents of which are incorporated herein by reference.

TECHNICAL FIELD

The present disclosure relates to a ceramic wiring member.

BACKGROUND ART

There has been known a ceramic wiring member including a main body portion and electroconductive portions. The main body portion is made of ceramic and has a plate-shaped portion. The electroconductive portions are arranged in contact with the plate-shaped portion. Such ceramic wiring member is used as a member for holding an electronic component. The electroconductive portions form a part of a path for a current to the electronic component or from the electronic component (see, for example, Japanese Patent Application Laid-open No. 2020-92234 (Patent Literature 1)). In such ceramic wiring member, it is important to reduce electrical resistance of the electroconductive portions. From such a point of view, employment of a metal having a low resistivity as metal for forming the electroconductive portions has been considered. Further, employment of a raw material powder having a small particle diameter as a raw material of the metal for forming the electroconductive portions has been considered.

CITATION LIST

Patent Literature

[PTL 1] JP 2020-92234 A

SUMMARY OF INVENTION

Technical Problem

However, even when the above-mentioned measures such as employment of a metal having a low resistivity and employment of a raw material powder having a small particle diameter are taken, the electrical resistance of the electroconductive portions may not be sufficiently reduced. Further, even when the electrical resistance is reduced, adhesive strength between the electroconductive portion and the main body portion made of ceramic may be insufficient.

One of the objects of the present disclosure is to provide a ceramic wiring member that enables achieving sufficient adhesive strength between an electroconductive portion and a main body portion made of ceramic while reducing electrical resistance of the electroconductive portion.

Solution to Problem

A ceramic wiring member according to the present disclosure includes: a main body portion made of ceramic; and an electroconductive portion arranged in contact with the main body portion. The electroconductive portion has a composition including: a first metal component corresponding to a main component, the first metal component being at least any one of tungsten (W) or molybdenum (Mo); at least one second metal component selected from the group consisting of nickel (Ni), cobalt (Co), and iron (Fe) at 0.1% or more and 10% or less in total to the first metal component; and a ceramic component. The electroconductive portion has a structure including: an electroconductive phase made of an alloy of the first metal component and the second metal component; and a glass phase, which is dispersed in the electroconductive phase and is made of the ceramic component at 3% or more and 20% or less in area ratio on a cross section of the electroconductive portion. Here, the symbol "%" represents a mass ratio (% by mass). This applies to the following description unless any other different definition is clearly indicated.

Advantageous Effects of Invention

According to the ceramic wiring member described above, sufficient adhesive strength between the electroconductive portion and the main body portion made of ceramic can be achieved while electrical resistance of the electroconductive portion is reduced.

DESCRIPTION OF EMBODIMENTS

Outline of Embodiments

Figure 1:
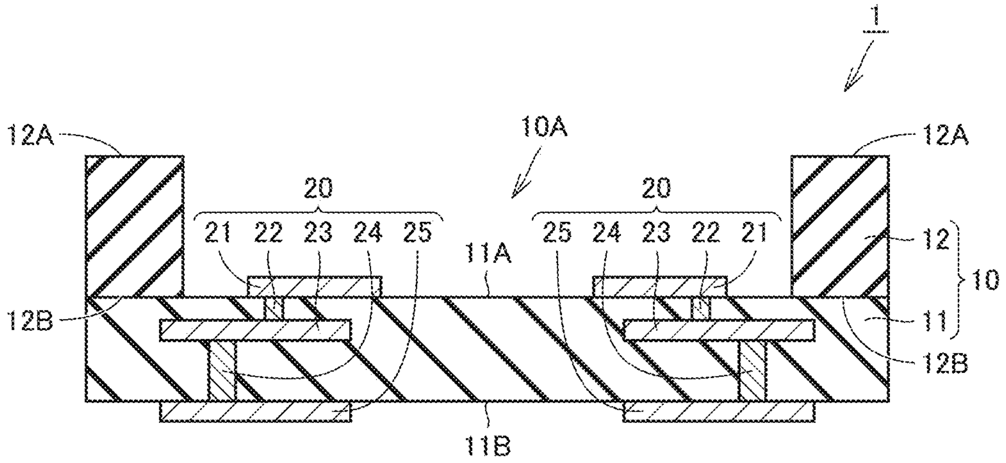
FIG. 1 is a schematic sectional view for illustrating a structure of a ceramic wiring member.

First, embodiments of the present disclosure are described in order. A ceramic wiring member according to the present disclosure includes: a main body portion made of ceramic; and an electroconductive portion arranged in contact with the main body portion. The electroconductive portion has a composition including: a first metal component corresponding to a main component, the first metal component being at least any one of W or Mo; and at least one second metal component selected from the group consisting of Ni, Co, and Fe at 0.1% or more and 10% or less in total to the first metal component. The electroconductive portion has a structure including an electroconductive phase made of an alloy of the first metal component and the second metal component.

The inventors of the present invention have examined a cause of the fact that the electrical resistance of the electroconductive portion is not sufficiently reduced even when the above-mentioned measures such as employment of a metal having a low resistivity and employment of a raw material powder having a small particle diameter are taken. As a result of examining the cause, the following finding has been obtained.

The ceramic wiring member described above is generally manufactured in the following manner. Green sheets containing ceramic for forming the main body portion are prepared. A paste containing a metal powder for forming the electroconductive portion is printed on the green sheets, and the green sheets are baked. At this time, according to the examination conducted by the inventors of the present invention, a molten glass phase made of a ceramic component intrudes into gaps in the metal powder due to a capillary action during a process of sintering of the metal powder contained in the paste. The glass phase inhibits the sintering of the metal powder and causes an increase in electrical resistance of the electroconductive portion. Further, the glass phase itself, which has intruded into the electroconductive portion, also causes an increase in electrical resistance of the electroconductive portion.

In the ceramic wiring member according to the present disclosure, the electroconductive portion has a composition including at least one second metal component selected from the group consisting of Ni, Co, and Fe at 0.1% or more and 10% or less to the first metal component corresponding to the main component, which is at least one of W or Mo. According to the examination conducted by the inventors of the present invention, the addition of the second metal component can reduce the intrusion of the glass phase into the electroconductive portion. Further, the addition of the second metal component can promote the sintering of the metal powder. As a result, the electrical resistance of the electroconductive portion is reduced. As described above, in the ceramic wiring member according to the present disclosure, the electrical resistance of the electroconductive portion can be reduced. Further, when the amount of addition of the second metal component is set at an appropriate ratio to the first metal component, adhesive strength between the main body portion made of ceramic and the electroconductive portion can also be ensured. Here, the first metal component corresponding to the main component of the electroconductive portion may be contained at 80% by mass or more of the entire electroconductive portion. The electroconductive portion may contain, besides the first metal component and the second metal component, for example, Au, Ag, or the like at 0.05% by mass or less of the entire electroconductive portion. A ratio of the electroconductive phase to the structure of the electroconductive portion may be 80% or more in area ratio. An average particle diameter of the first metal component before baking (raw material powder) may be 0.1 μm or larger and 5.5 μm or smaller. An average particle diameter of the second metal component (raw material powder) before baking may be 0.1 μm or larger and 10 μm or smaller.

In the ceramic wiring member described above, the electroconductive portion may have a composition further including a ceramic component. The electroconductive portion may have a structure further including a glass phase that is dispersed in the electroconductive phase and is made of a ceramic component at an area ratio of 3% or more and 20% or less, preferably 8% or more and 20% or less on a cross section of the electroconductive portion. In this application, the glass phase may contain, besides a glass component contained in the main body portion, a slight amount of crystal of a ceramic main component (alumina) contained in the main body portion or a metal component contained in the electroconductive portion. Further, the glass phase may contain a glass component that is not contained in the main body portion.

In terms of a reduction of a difference in linear expansion coefficient between the electroconductive portion and the main body portion, the glass phase may be dispersed in the electroconductive phase. In this case, when a ratio of the glass phase is set to 20% or less in area ratio on the cross section of the electroconductive portion, an increase in electrical resistance of the electroconductive portion can be suppressed. When the ratio of the glass phase is set to 3% or more, further 8% or more, adhesion between the electroconductive portion and the main body portion can be improved.

In the ceramic wiring member described above, an average particle diameter of metal particles in the electroconductive phase may be 1.2 μm or larger and 5.5 μm or smaller. Thus, the ceramic wiring member that is excellent in the electrical resistance of the electroconductive portion and the adhesion between the electroconductive portion and the main body portion can be obtained. The average particle diameter of the metal particles in the electroconductive phase may be 1.2 μm or larger and 1.6 μm or smaller.

In the ceramic wiring member described above, it is preferred that the structure of the electroconductive portion be devoid of an intermetallic compound phase made of an intermetallic compound of the first metal component and the second metal component.

The intermetallic compound of the first metal component and the second metal component has a lower electroconductivity than that of the alloy of the first metal component and the second metal component. Thus, the absence of the intermetallic compound enables suppression of an increase in electrical resistance of the electroconductive portion.

In the ceramic wiring member described above, the main body portion may have a plate-shaped portion. The electroconductive portion may include: a first portion being in contact with a first principal surface of the plate-shaped portion; and a second portion being in contact with a second principal surface of the plate-shaped portion, the second principal surface being positioned on a side opposite to the first principal surface in a thickness direction of the plate-shaped portion. As described above, when the first principal surface side and the second principal surface side of the plate-shaped portion are electrically connected to each other through intermediation of the electroconductive portion reduced in electrical resistance, a high-performance ceramic wiring member that is adaptable to power saving and higher communication speed can be obtained.

Specific Examples of Embodiments

Next, specific embodiments of a ceramic wiring member according to the present disclosure are described with reference to the drawings. In the drawings referred to below, the same or corresponding parts are denoted by the same reference symbols, and a description thereof is not repeated.

First Embodiment

FIG. 1 is a schematic sectional view for illustrating a structure of a ceramic wiring member according to one embodiment of the present disclosure. With reference to FIG. 1, a ceramic wiring member 1 according to this embodiment includes a main body portion 10 made of ceramic and electroconductive portions 20. The ceramic for forming the main body portion 10 is not particularly limited, but, for example, alumina (aluminum oxide) can be employed. Further, the ceramic for forming the main body portion 10 may contain, as a sintering aid, at least one glass component selected from the group consisting of an oxide containing Si, an oxide containing Ca, an oxide containing Mg, an oxide containing Mn, and an oxide containing Ba. The main body portion 10 includes a bottom wall portion 11 and a side wall portion 12. The bottom wall portion 11 corresponds to a first plate-shaped portion having a plate-like shape. The side wall portion 12 corresponds to a second plate-shaped portion having a plate-like shape. The bottom wall portion 11 has a flat plate-like shape. The bottom wall portion 11 has a first principal surface 11A and a second principal surface 11B. The second principal surface 11B is positioned on a side opposite to the first principal surface 11A in a thickness direction. A shape in plan view (shape viewed in a direction perpendicular to the first principal surface 11A) of the bottom wall portion 11 is, for example, rectangular.

The side wall portion 12 has a plate-like shape rising from an outer edge of the first principal surface 11A of the bottom wall portion 11. More specifically, the side wall portion 12 has a shape, for example, formed by connecting four flat plates corresponding to sides of the outer edge of the first principal surface 11A of the bottom wall portion 11 having a rectangular shape in plan view. The side wall portion 12 may be arranged, for example, so as to surround a cavity 10A being a space above the first principal surface 11A when viewed in the direction perpendicular to the first principal surface 11A. The side wall portion 12 includes a first end surface 12A and a second end surface 12B. The first end surface 12A has a planar shape. The second end surface 12B is an end surface having a planar shape on a side opposite to the first end surface 12A in the thickness direction of the bottom wall portion 11. The side wall portion 12 is connected to the first principal surface 11A of the bottom wall portion 11 at the second end surface 12B. The first end surface 12A is entirely positioned on a single plane. As a result, when a lid member having a flat plate shape is placed on the first end surface 12A, the cavity 10A can be closed. An electronic component that requires airtightness, such as a quartz crystal unit can be housed inside the cavity 10A. The ceramic wiring member 1 described above can be used as a ceramic package.

In this embodiment, the ceramic wiring member 1 includes a pair of electroconductive portions 20. Each of the electroconductive portions 20 includes an internal terminal 21, an external terminal 25, and an internal wiring 23. The internal terminal 21 corresponds to a first portion arranged in contact with the first principal surface 11A. The external terminal 25 corresponds to a second portion arranged in contact with the second principal surface 11B. The internal wiring 23 is arranged inside the bottom wall portion 11. Each of the electroconductive portions 20 further includes a first connecting portion 22 and a second connecting portion 24. The first connecting portion 22 connects the internal terminal 21 and the internal wiring 23 to each other. The second connecting portion 24 connects the internal wiring 23 and the external terminal 25 to each other. The internal wiring 23, the first connecting portion 22, and the second connecting portion 24 are third portions that connect the internal terminal 21 corresponding to the first portion and the external terminal 25 corresponding to the second portion to each other. Each of the internal terminal 21, the external terminal 25, the internal wiring 23, the first connecting portion 22, and the second connecting portion 24 is a part of the electroconductive portion 20 that is arranged in contact with the bottom wall portion 11 corresponding to the first plate-shaped portion. As a modification example of the first connecting portion 22 and the second connecting portion 24, for example, a castellation may be formed in a side surface of the bottom wall portion 11, and an electroconductive portion may be provided on a surface of the castellation.

At least one, preferably all, of the internal terminal 21, the external terminal 25, the internal wiring 23, the first connecting portion 22, and the second connecting portion 24 of the electroconductive portion 20 has a composition including a first metal component and at least one second metal component. The first metal component corresponds to a main component and is at least any one of W or Mo. The at least one second metal component is selected from the group consisting of Ni, Co, and Fe and is contained at 0.1% or more and 10% or less in total to the first metal component. At least one, preferably all, of the internal terminal 21, the external terminal 25, the internal wiring 23, the first connecting portion 22, and the second connecting portion 24 of the electroconductive portion 20 has a structure including an electroconductive phase made of an alloy of the first metal component and the second metal component. The term "alloy" refers to not only a solid solution of the first metal component and the second metal component but also a mixture of the first metal component and the second metal component, which has not formed a solid solution.

In the ceramic wiring member 1 according to this embodiment, addition of the second metal component as a metal component of the electroconductive portions 20 can reduce the intrusion of the glass phase into the electroconductive portions 20. Further, the addition of the second metal component can promote the sintering of the metal power in the electroconductive portions 20. As a result, the ceramic wiring member 1 is a ceramic wiring member including the electroconductive portions 20 reduced in electrical resistance.

Figure 2:
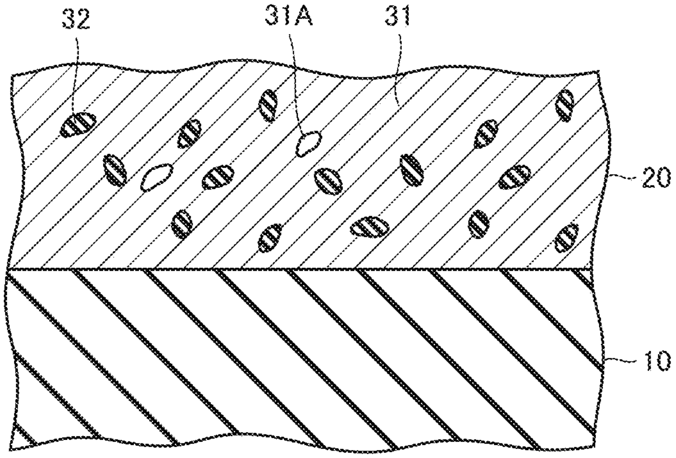
FIG. 2 is a schematic sectional view for illustrating a structure around an interface between a main body portion (plate-shaped portion) and an electroconductive portion.

FIG. 2 is a schematic sectional view for illustrating a structure around an interface between the main body portion 10 and the electroconductive portion 20. With reference to FIG. 2, the electroconductive portion 20 is arranged in contact with the main body portion 10. The electroconductive portion 20 may further contain a ceramic component in addition to the metal components described above. The structure of the electroconductive portion 20 may further contain a glass phase 32 in addition to an electroconductive phase 31. The glass phase 32 is dispersed in the electroconductive phase 31 and is made of the ceramic component at 3% or more and 20% or less in area ratio on a cross section taken in the thickness direction of the bottom wall portion 11 corresponding to the first plate-shaped portion. When the area ratio of the glass phase is set to 20% or less, an increase in electrical resistance of the electroconductive portion 20 can be suppressed. When the area ratio of the glass phase is set to 3% or more, desirably 8% or more, a difference in linear expansion coefficient between the electroconductive portion 20 and the main body portion 10 can be reduced. The glass phase 32 in the electroconductive portions 20 basically intrudes from the main body portion due to a capillary action at the time of sintering. However, a glass component that is not contained in the main body portion 10 may be contained in the glass phase 32. In terms of the electrical resistance and strength, it is desired that an air gap 31A that is not filled with the glass phase 32 be 5% or less, more desirably 1% or less in area ratio on the cross section of the electroconductive portion 20.

Further, it is preferred that the structure of the electroconductive portion 20 be devoid of an intermetallic compound phase made of an intermetallic compound of the first metal component and the second metal component. It is preferred that the intermetallic compound phase be reduced as much as possible, more preferably not be contained because the intermetallic compound phase causes a reduction in electroconductivity. Here, the “state in which the intermetallic compound phase is not contained” refers to a state in which, when the electroconductive portion 20 is analyzed through X-ray diffraction, a peak corresponding to crystal of the intermetallic compound phase is equal to or lower than a noise level.

Further, it is desired that, in the structure of the electroconductive portion 20, an average particle diameter of the metal particles in the electroconductive phase be 1.2 μm or larger and 5.5 μm or smaller. When the average particle diameter is smaller than 1.2 μm, the electrical resistance of the electroconductive portion 20 increases. Meanwhile, when the average particle diameter exceeds 5.5 μm, adhesive strength of the electroconductive portion 20 to the main body portion decreases. The average particle diameter in the electroconductive phase can be adjusted by changing a baking temperature, baking time, and particle diameters of the metal powders (raw material powders) of the first and second metal components. Further, the average particle diameter can also be adjusted by increasing and decreasing a rate of the glass phase 32 contained in the electroconductive portion 20.

Figure 3:
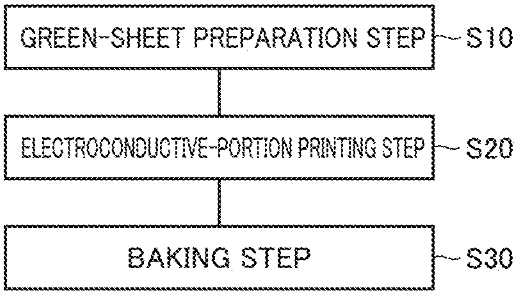
FIG. 3 is a flowchart for outlining a method of manufacturing the ceramic wiring member.

Next, one example of a method of manufacturing the ceramic wiring member 1 according to this embodiment is described. FIG. 3 is a flowchart for outlining the method of manufacturing the ceramic wiring member. With reference to FIG. 3, in the method of manufacturing the ceramic wiring member 1 according to this embodiment, a green-sheet preparation step is first carried out as Step S10. In Step S10, green sheets, which are used to form the main body portion 10, are prepared. Specifically, a ceramic powder, for example, an alumina powder, and a sintering aid powder, which form the main body portion 10, and further, a resin, a solvent, and the like, which do not form the main body portion 10 (specifically, disappear at the time of baking), are mixed together in a ball mill to obtain a slurry. The slurry is processed into a green sheet through a doctor blade process. As a result, the green sheets, which are used to form the main body portion 10, are obtained. Here, With reference to FIG. 1, a plurality of green sheets, each having a rectangular shape in plan view, are prepared as green sheets that are used to form the bottom wall portion 11. Further, a plurality of green sheets that are used to form the side wall portion 12 are also prepared. As the green sheets used to form the side wall portion 12, Loop-shaped green sheets, each having a rectangular shape in plan view and being obtained by removing a portion (central portion) corresponding to the cavity 10A, are prepared.

Next, an electroconductive-portion printing step is carried out as Step S20. In Step S20, a paste used to form the electroconductive portions 20 is printed on the green sheets, which have been prepared in Step S10. Specifically, the first metal component corresponding to the main component, which is at least one of W or Mo, at least one second metal component selected from the group consisting of Ni, Co, and Fe, an additive, a resin, a solvent, and the like are blended. Further, a ceramic powder is added as needed and kneaded to form a paste. The ceramic powder may be the same as that used to form the main body portion 10 or may be different therefrom.

The paste is printed by, for example, screen printing on the green sheets prepared in Step S10. As a result, with reference to FIG. 1, the green sheet having the paste printed on regions corresponding to the external terminals 25, the green sheet having the paste printed on regions corresponding to the second connecting portions 24, the green sheet having the paste printed on regions corresponding to the internal wiring 23, the green sheet having the paste printed on regions corresponding to the first connecting portions 22, and the green sheet having the paste printed on regions corresponding to the internal terminals 21 are formed as the green sheets to be used to form the bottom wall portion 11 and are dried. After that, the green sheets are laminated in the stated order. The drying can be carried out under a condition of, for example, heating at 110° C. and holding for five minutes.

Further, a plurality of green sheets (Loop-shaped green sheets, each obtained by removing the portion corresponding to the cavity 10A), which have been prepared in Step S10 and are used to form the side wall portion 12, are further laminated. In this manner, a laminate of the green sheets is obtained.

Next, a baking step is carried out as Step S30. In this step, the laminate of the green sheets, which has been prepared in Step S20, is baked. The baking is performed by, for example, heating at a temperature of 800° C. or higher and 1,600° C. or lower in an atmosphere of a mixture of hydrogen, nitrogen, and water vapor. The heating temperature is selected, in consideration of sufficient progress of sintering, from a temperature range that enables suppression of formation of an intermetallic compound phase made of an intermetallic compound of the first metal component and the second metal component in the structure of the electroconductive portions 20. Through the procedure described above, the ceramic wiring member 1 according to this embodiment can be manufactured.

Second Embodiment

Figure 4:
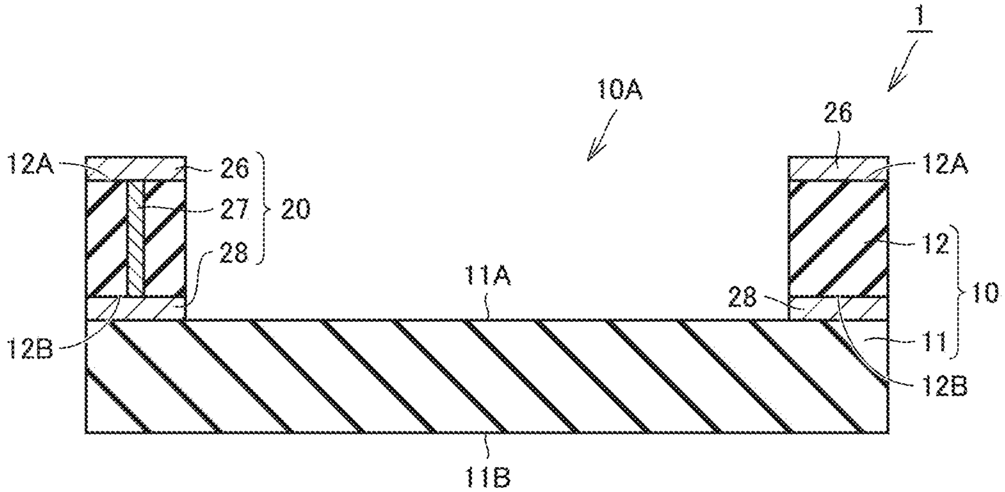
FIG. 4 is a schematic sectional view for illustrating a structure of a ceramic wiring member according to a second embodiment.

Next, a second embodiment, which is another embodiment of the present disclosure, is described. FIG. 4 is a schematic sectional view for illustrating a structure of a ceramic wiring member according to the second embodiment. FIG. 4 corresponds to FIG. 1 that has been referred to for the description of the first embodiment. With reference to FIG. 4 and FIG. 1, a ceramic wiring member 1 according to the second embodiment basically has the same configurations as those of the ceramic wiring member according to the first embodiment and provides the same effects. However, the ceramic wiring member 1 according to the second embodiment is different from that according to the first embodiment mainly in the arrangement and the structure of the electroconductive portions. Now, the second embodiment is described mainly for differences from the first embodiment.

With reference to FIG. 4, the electroconductive portions 20 of the ceramic wiring member 1 according to the second embodiment each include an upper terminal 26, a lower terminal 28, and a third connecting portion 27. The upper terminal 26 corresponds to a first portion arranged in contact with a first end surface 12A. The lower terminal 28 corresponds to a second portion arranged in contact with a second end surface 12B. The third connecting portion 27 connects the upper terminal 26 and the lower terminal 28 to each other. The lower terminal 28 is arranged in contact also with a first principal surface 11A of a bottom wall portion 11. Each of the upper terminal 26, the lower terminal 28, and the third connecting portion 27 is a part of the electroconductive portion 20 that is arranged in contact with a side wall portion 12 corresponding to a second plate-shaped portion.

Similarly to the internal terminal 21 or the like according to the first embodiment, at least one of, preferably all, of the upper terminal 26, the lower terminal 28, and the third connecting portion 27 of the electroconductive portion 20 has a composition including a first metal component and at least one second metal component. The first metal component corresponds to a main component and is at least any one of W or Mo. The at least one second metal component is selected from the group consisting of Ni, Co, and Fe and is contained at 0.1% or more and 10% or less in total to the first metal component. Further, similarly to the internal terminal 21 or the like according to the first embodiment, at least one, preferably all, of the upper terminal 26, the lower terminal 28, and the third connecting portion 27 of the electroconductive portion 20 has a structure including an electroconductive phase made of an alloy of the first metal component and the second metal component. Further, at least one, preferably all, of the upper terminal 26, the lower terminal 28, and the third connecting portion 27 of the electroconductive portion 20 has a structure including a glass phase 32 made of a ceramic component at 3% or more and 20% or less in area ratio on a cross section of the electroconductive portion 20.

Also from the ceramic wiring member 1 according to this embodiment, the same effects as those obtained in the first embodiment can be obtained. Further, the ceramic wiring member 1 according to this embodiment can be manufactured in the same manner as in the first embodiment except mainly for a change in the arrangement of the electroconductive portions 20. In this embodiment, the bottom wall portion 11 is made of ceramic, which is an insulator. However, a conductor such as metal may be employed as a material for forming the bottom wall portion 11.

Third Embodiment

Figure 5:
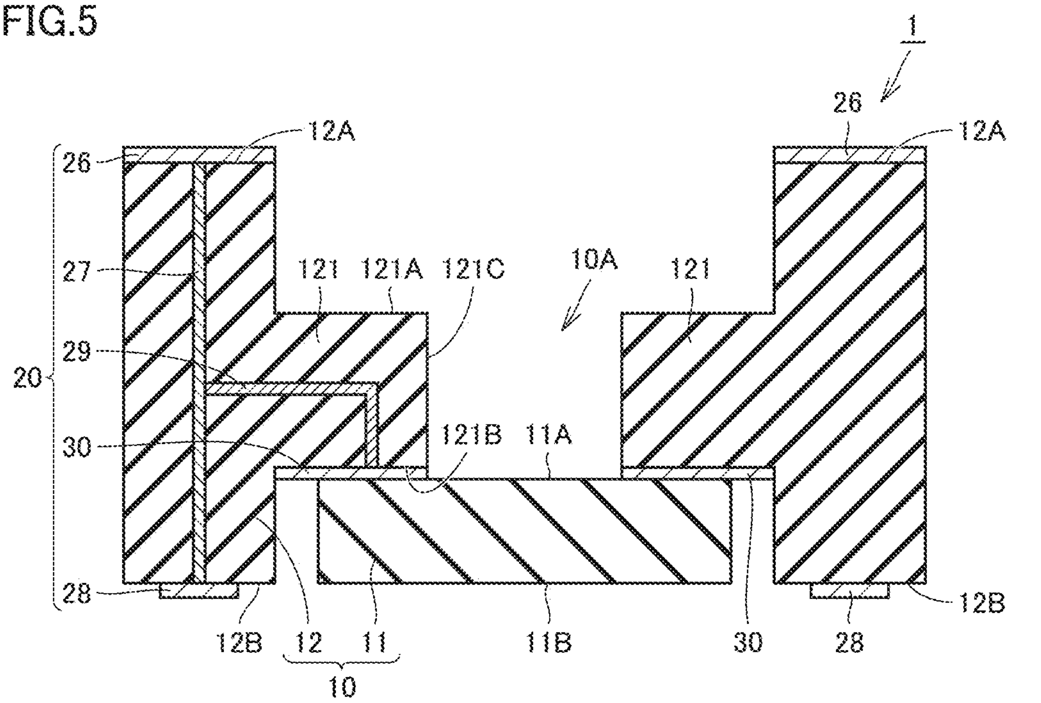
FIG. 5 is a schematic sectional view for illustrating a structure of a ceramic wiring member according to a third embodiment.

Next, a third embodiment, which is still another embodiment of the present disclosure, is described. FIG. 5 is a schematic sectional view for illustrating a structure of a ceramic wiring member according to the third embodiment. FIG. 5 corresponds to FIG. 1 that has been referred to for the description of the first embodiment. With reference to FIG. 5 and FIG. 1, a ceramic wiring member 1 according to the third embodiment basically has the same configurations as those of the ceramic wiring member according to the first embodiment and provides the same effects. However, the ceramic wiring member 1 according to the third embodiment is different from that according to the first embodiment mainly in the structure of the main body portion and the arrangement and the structure of the electroconductive portions. Now, the third embodiment is described mainly for differences from the first embodiment.

With reference to FIG. 5, a side wall portion 12 of the ceramic wiring member 1 according to the third embodiment includes protruding portions 121. The protruding portions 121 protrude toward regions that face each other across a cavity 10A. Each of the protruding portions 121 includes a first surface 121B, a second surface 121A, and a third surface 121C. The first surface 121B faces a first principal surface 11A of a bottom wall portion 11. The second surface 121A is positioned on a side opposite to the first surface 121B in a thickness direction of the bottom wall portion 11. The third surface 121C is a distal end surface that connects the first surface 121B and the second surface 121A to each other. A region of the first surface 121B, which includes its distal end connected to the third surface 121C, faces the first principal surface 11A, and the other region (region corresponding to the vicinity of a root of the protruding portion 121) does not face the first principal surface 11A.

The electroconductive portions 20 each include an upper terminal 26, a lower terminal 28, and a third connecting portion 27. The upper terminal 26 corresponds to a first portion arranged in contact with a first end surface 12A. The lower terminal 28 corresponds to a second portion arranged in contact with a second end surface 12B. The third connecting portion 27 connects the upper terminal 26 and the lower terminal 28 to each other. The electroconductive portion 20 further includes an intermediate terminal 30 and a fourth connecting portion 29. The intermediate terminal 30 is arranged in contact with the first surface 121B. The fourth connecting portion 29 connects the intermediate terminal 30 and the third connecting portion 27 to each other. The intermediate terminal 30 is arranged so as to be also in contact with the first principal surface 11A of the bottom wall portion 11. Each of the upper terminal 26, the lower terminal 28, the third connecting portion 27, the intermediate terminal 30, and the fourth connecting portion 29 is a part of the electroconductive portion 20 that is arranged in contact with the side wall portion 12.

Similarly to the internal terminal 21 or the like according to the first embodiment, at least one, preferably all, of the upper terminal 26, the lower terminal 28, the third connecting portion 27, the intermediate terminal 30, and the fourth connecting portion 29 of the electroconductive portion 20 has a composition including a first metal component and at least one second metal component. The first metal component corresponds to a main component and is at least any one of W or Mo. The at least one second metal component is selected from the group consisting of Ni, Co, and Fe and is contained at 0.1% or more and 10% or less in total to the first metal component. Further, similarly to the internal terminal 21 or the like according to the first embodiment, at least one, preferably all, of the upper terminal 26, the lower terminal 28, and the third connecting portion 27 of the electroconductive portion 20 has a structure including an electroconductive phase made of an alloy of the first metal component and the second metal component. Further, at least one, preferably all, of the upper terminal 26, the lower terminal 28, the third connecting portion 27, the intermediate terminal 30, and the fourth connecting portion 29 of the electroconductive portion 20 has a structure including a glass phase 32 made of a ceramic component at 3% or more and 20% or less in area ratio on a cross section of the electroconductive portion 20.

Also from the ceramic wiring member 1 according to this embodiment, the same effects as those obtained in the first embodiment can be obtained. Further, the ceramic wiring member 1 according to this embodiment can be manufactured in the same manner as in the first embodiment except mainly for a change in the structure of the main body portion 10 and the arrangement of the electroconductive portions 20. In this embodiment, the bottom wall portion 11 is made of ceramic, which is an insulator. However, a conductor such as metal may be employed as a material for forming the bottom wall portion 11. Further, in the embodiments described above, the shapes of the main body portion 10 have been exemplified. However, the shape of the main body portion according to the present disclosure is not limited to those exemplified above. Various shapes such as a cuboidal shape, a spherical shape, and a membranous shape can be employed as the shape of the main body portion.

EXAMPLES

An experiment for confirming an effect of the addition of the second metal component to reduce the electrical resistance was conducted. A procedure of the experiment is as follows.

Electroconductive portions, which were arranged in contact with a main body portion, were formed in the same procedure as that of the manufacturing method described above in the embodiments, and a resistivity of the electroconductive portions was checked. Specifically, green sheets containing an alumina powder were prepared in Step S10.

Next, in Step S20, a paste containing the first metal component and the second metal component was printed on the green sheets prepared in Step S10 and was dried. A ceramic component was not added to the paste. The drying was performed under a condition of heating at 110° C. and holding for five minutes. In this case, W or Mo was employed as the first metal component. As the metal powder (raw material powder) of the first metal component, a powder having an average particle diameter of 1 μm was employed in most of samples. For some samples, however, a powder having an average particle diameter of 2.5 μm was also employed. Further, Ni, Co, and Fe were employed as the second metal component. In this case, the amount of addition was changed so as to check an appropriate amount of addition. Further, for comparison, samples without addition of the second metal component were also formed. As the second metal component, one of Ni, Co, and Fe was employed in most of the samples. However, samples containing both of Ni and Co were also formed.

Then, in Step S30, the green sheets having the paste printed thereon were baked. The baking was performed by heating in an atmosphere of a mixture of hydrogen, nitrogen, and water vapor. A heating temperature was set to 1,400° C. for most of the samples employing W as the first metal component and to 1,300° C. for most of the samples employing Mo as the first metal component. For comparison, a sample employing W as the first metal component, which was baked at 1,550° C., and a sample employing Mo as the first metal component, which was baked at 1,400° C., were also formed. An air gap in the electroconductive portion after baking, which was not filled with the glass phase, was 1% or less in area ratio.

A resistivity was checked for the obtained samples. Specifically, electrical resistance was first measured by a 4-terminal method for the obtained samples. For the measurement of the electrical resistance, RM3544-01 manufactured by Hioki E.E. Corporation was used. Then, the resistivity was calculated from the obtained electrical resistance, a length of the electroconductive portion, and a sectional area thereof perpendicular to a longitudinal direction. Further, adhesive strength of the electroconductive portion to the main body portion was measured for the obtained samples. Specifically, a Ni-plating layer having a thickness of from 2 μm to 3 μm was formed on an electroconductive portion having a width of 2 mm and a length of 5 mm. An L-shaped holding member made of metal with a width of 0.7 mm, a length of 5 mm, and a height of 2.5 mm in a direction perpendicular to a length direction was bonded by brazing at its portion having the length of 5 mm. Next, the holding member and the sample were held, and a distal end portion of the holding member, which had the height of 2.5 mm, was pulled in a direction perpendicular to an interface between the electroconductive portion and the main body portion. A load at a time when the electroconductive portion was separated from the main body portion was measured as the adhesive strength. For the measurement, a digital force gauge (model number ZP200N) manufactured by IMADA Co., Ltd. was used. When the adhesive strength is 9.8 N (1 kgf) or larger, the adhesive strength is determined as sufficient. When the adhesive strength is less than 9.8 N, the adhesive strength is determined as insufficient.

Figure 6:
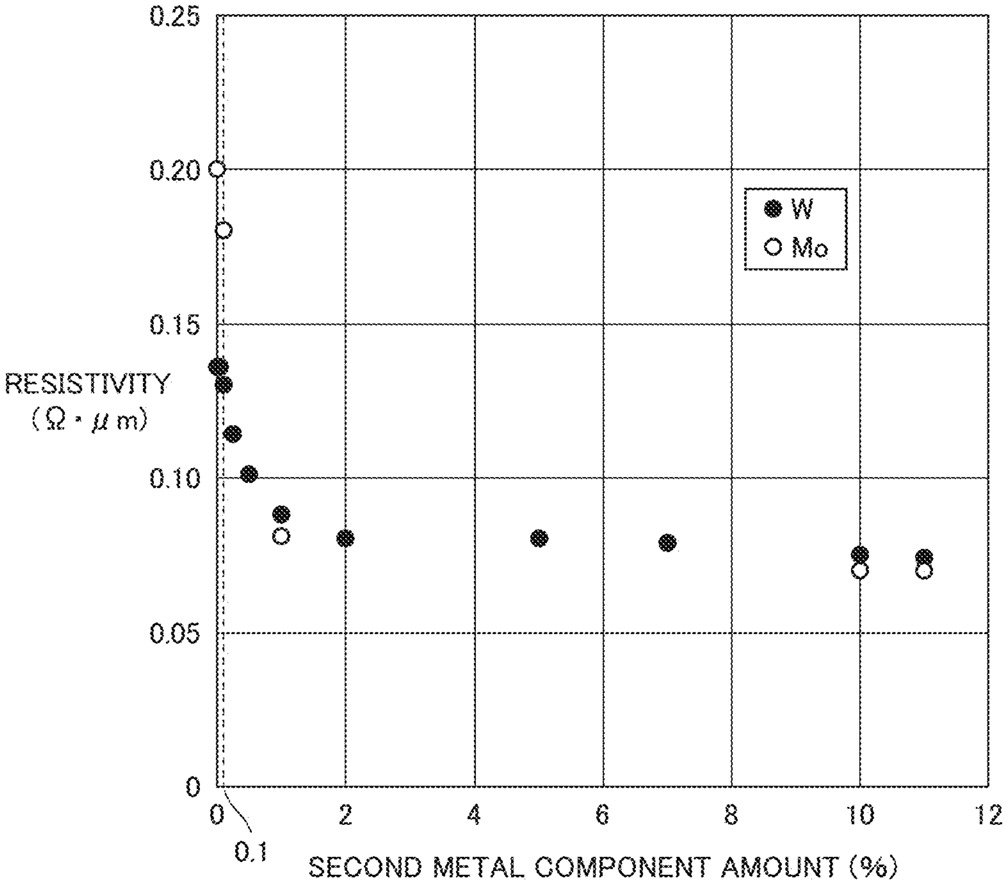
FIG. 6 is a graph for showing a relationship between the amount of addition of a second metal component and a resistivity.

Contents and the resistivity of each of the samples are shown in Table 1. Further, a relationship between the amount of the second metal component and the resistivity is shown in FIG. 6 for samples 1 to 11 and 19 to 23 of Table 1. In FIG. 6, a horizontal axis represents the amount of the second metal component, that is, the amount of the second metal component relative to the first metal component. For example, 2% indicated on the horizontal axis means that a mass of the second metal component is 2 when a mass of the first metal component is defined as 100. In FIG. 6, a vertical axis represents the resistivity. In FIG. 6, data points represented by solid circles correspond to the samples 1 to 11 in Table 1, each employing W as the first metal component. Data points represented by open circles correspond to the samples 19 to 23 in Table 1, each employing Mo as the first metal component.

TABLE 1

| | First metal component | | Second metal component | | | | |
|---|---|---|---|---|---|---|---|
| Sample number | Material | Average particle diameter of raw material powder (μm) | Material | Amount of addition (%) | Baking temperature (° C.) | Resistivity (Ω · μm) | Adhesive strength (N) |
| 1 | W | 1 | — | 0 | 1,400 | 0.136 | 49.1 |
| 2 | W | 1 | Ni | 0.05 | 1,400 | 0.136 | 49.5 |
| 3 | W | 1 | Ni | 0.1 | 1,400 | 0.130 | 49.0 |
| 4 | W | 1 | Ni | 0.25 | 1,400 | 0.114 | 42.2 |
| 5 | W | 1 | Ni | 0.5 | 1,400 | 0.101 | 39.6 |
| 6 | W | 1 | Ni | 1.0 | 1,400 | 0.088 | 33.8 |
| 7 | W | 1 | Ni | 2.0 | 1,400 | 0.080 | 29.9 |
| 8 | W | 1 | Ni | 5.0 | 1,400 | 0.080 | 19.5 |
| 9 | W | 1 | Ni | 7.0 | 1,400 | 0.079 | 15.1 |

TABLE 1-continued

| | First metal component | | Second metal component | | | | |
|---|---|---|---|---|---|---|---|
| Sample number | Material | Average particle diameter of raw material powder (μm) | Material | Amount of addition (%) | Baking temperature (° C.) | Resistivity (Ω · μm) | Adhesive strength (N) |
| 10 | W | 1 | Ni | 10.0 | 1,400 | 0.075 | 10.0 |
| 11 | W | 1 | Ni | 11.0 | 1,400 | 0.074 | 8.0 |
| 12 | W | 1 | Co | 0.1 | 1,400 | 0.125 | 49.1 |
| 13 | W | 1 | Co | 10.0 | 1,400 | 0.080 | 11.1 |
| 14 | W | 1 | Fe | 0.1 | 1,400 | 0.130 | 48.8 |
| 15 | W | 1 | Fe | 10.0 | 1,400 | 0.080 | 12.1 |
| 16 | W | 1 | Ni, Co | 0.5 each | 1,400 | 0.092 | 36.7 |
| 17 | W | 2.5 | — | 0 | 1,400 | 0.246 | 52.4 |
| 18 | W | 2.5 | Ni | 10.0 | 1,400 | 0.158 | 14.0 |
| 19 | Mo | 1 | — | 0 | 1,300 | 0.200 | 51.5 |
| 20 | Mo | 1 | Ni | 0.1 | 1,300 | 0.180 | 51.5 |
| 21 | Mo | 1 | Ni | 1.0 | 1,300 | 0.081 | 42.3 |
| 22 | Mo | 1 | Ni | 10.0 | 1,300 | 0.070 | 10.5 |
| 23 | Mo | 1 | Ni | 11.0 | 1,300 | 0.070 | 7.5 |
| 24 | W | 1 | Ni | 0.5 | 1,550 | 0.190 | 39.6 |
| 25 | Mo | 1 | Ni | 0.5 | 1,400 | 0.240 | 44.7 |

With reference to Table 1, in the samples 1 and 2 among the samples 1 to 11, the amount of the second metal component was below the lower limit according to the present disclosure. Meanwhile, in the sample 11, the amount of the second metal component exceeded the upper limit according to the present disclosure. Further, in the sample 19 among the samples 19 to 23, the amount of the second metal component was below the lower limit according to the present disclosure. Meanwhile, in the sample 23, the amount of the second metal component exceeded the upper limit according to the present disclosure.

With reference to FIG. 6 in which the results of the experiment described above are shown, it is confirmed that the resistivity can be reduced by setting the amount of addition of Ni corresponding to the second metal component to 0.1% or more, which is a range according to the present disclosure, regardless of whether the first metal component is W or Mo. Further, when the amount of addition of the second metal component is set to 0.5% or more, the resistivity can be further clearly reduced. Meanwhile, with reference to Table 1, when the amount of addition of the second metal component exceeded 10%, the adhesive strength between the main body portion made of ceramic and the electroconductive portion was reduced. It can be considered that such reduction in adhesive strength was caused because an excessively large amount of addition of the second metal component excessively progressed the sintering of the raw material powder in the main body portion during the sintering process performed in Step S30. Further, when the amount of addition of the second metal component exceeded 1.5%, the reduction in resistivity was saturated. From the results of the experiment described above, it was confirmed that the amount of addition of the second metal component was required to be 0.1% or more of the first metal component, preferably 0.5% or larger in terms of a reduction in resistivity. Meanwhile, in terms of the adhesive strength between the electroconductive portion and the main body portion made of ceramic, it is preferred that the amount of addition of the second metal component be set to 10% or less. The amount of addition of the second metal component may be 1.5% or less because of the saturation of a reduction in resistivity.

Further, with reference to Table 1, Co or Fe was employed as the second metal component in the samples 12 to 15 in place of Ni that was employed in the samples 1 to 11. Based on the resistivities of these samples, it was confirmed that the same effects as those obtained in a case in which Ni was employed as the second metal component were obtained when Co or Fe was employed as the second metal component. Further, in the sample 16, both of Ni and Co were added as the second metal component at 0.5% for each to the first metal component. Even in this case, it was confirmed that the same effects as those in the case in which Ni was employed as the second metal component were obtained.

Further, from the results regarding the samples 17 and 18, it was confirmed that, even when the average particle diameter of the raw material powder of the first metal component was changed, the resistivity of the sample 18 containing the second metal component was clearly reduced in comparison to the sample 17 without the second metal component. From the results described above, it was confirmed that, even when the average particle diameter of the raw material powder of the first metal component was changed, a reduction in electrical resistance was successfully achieved by adding an adequate amount of the second metal component.

Further, for the samples 24 and 25, the baking temperature was set high. When the second metal component is Ni, the baking temperature of 1,550° C. for the sample 24 employing W as the first metal component and the baking temperature of 1,400° C. for the sample 25 employing Mo as the first metal component define a temperature range in which an intermetallic compound of the first metal component and the second metal component is generated. As a result of analysis of the electroconductive portion of the sample 29 with an X-ray diffractometer (MiniFlex II) manufactured by Rigaku Corporation, a peak corresponding to an intermetallic compound of W and Ni, which had a magnitude exceeding a noise level, was detected. As a result of a similar measurement for the sample 30, a peak corresponding to an intermetallic compound of Mo and Ni, which had a magnitude exceeding the noise level, was detected. Meanwhile, for the samples 1 to 28, a peak corresponding to an intermetallic compound as described above was not detected.

From the above-mentioned results of the experiment, it was confirmed that the ceramic wiring member according to the present disclosure enabled a reduction in electrical resistance of the electroconductive portion.

Further, an experiment for checking an effect of the area ratio of the glass phase and the average particle diameter of the metal particles in the electroconductive phase after baking on the resistivity of the electroconductive portion and the adhesive strength of the electroconductive portion to the main body portion was conducted.

Samples shown in Table 2 were formed by the same manufacturing method as that for forming the samples shown in Table 1 referred to above. An area ratio of the glass phase to the electroconductive portion on the cross section taken in the thickness direction of the plate-shaped portion was checked for samples 26 to 40. Specifically, the cross section of the electroconductive portion 20 was observed with a scanning electron microscope for the obtained samples. Then, after obtained image data was monochromatically binarized with image processing software, areas of the glass phase 32 were added up to thereby calculate an area ratio of the glass phase 32 to the electroconductive portion 20. For the image processing described above, ImageJ (free software) was used. A numerical value of the second metal component indicates the amount of addition (% by mass) of the second metal component to 100% by mass of the first metal component. Further, the baking temperature was set to 1,400° C. for all the samples. Further, a method of measuring the average particle diameter in the electroconductive phase after baking was as follows. First, a surface or a cross section of the electroconductive portion after baking was observed with the scanning electronic microscope, and an image thereof was photographed. Then, a reference line was drawn on the electroconductive portion of the obtained image, and a distance between a start point and an end point of the reference line was obtained. Next, the number of particles in the electroconductive phase, which were in contact with the reference line, was counted. It is desirable that the number of particles in the electroconductive phase, which are in contact with the reference line, be twenty or more. It is preferred that a length of the reference line be adjusted so that the number of particles in the electroconductive phase, which are in contact with the reference line, becomes twenty or more. A value calculated by dividing the distance between the start point and the end point of the reference line on the image by the number of particles in the electroconductive phase, which were in contact with the reference line, was obtained. This calculation was repeated three times for different reference lines, and an average value of the obtained three values was used as the average particle diameter in the electroconductive phase after baking.

TABLE 2

| Sample number | First metal component | Second metal component | Area ratio of glass phase (%) | Evaluation items: Resistivity (Ω · μm) Determination | | Evaluation items: Adhesive strength (N) Determination | | Evaluation items: Comprehensive determination | Average particle diameter in electroconductive phase before baking (μm) | Average particle diameter in electroconductive phase after baking (μm) | Baking temperature (° C.) |
|---|---|---|---|---|---|---|---|---|---|---|---|
| 26 | W | None | 38.0 | Fail | 0.25 | Pass | 46.1 | Fail | 1.1 | 1.1 | 1,400 |
| 27 | W | Ni: 0.1% | 19.8 | Pass | 0.12 | Pass | 38.3 | Pass | 0.8 | 1.3 | 1,400 |
| 28 | W | Ni: 0.25% | 8.2 | Pass | 0.11 | Pass | 19.6 | Pass | 0.8 | 1.5 | 1,400 |
| 29 | W | Ni: 0.5% | 7.8 | Pass | 0.10 | Pass | 20.6 | Pass | 0.8 | 2.4 | 1,400 |
| 30 | W | Ni: 1.0% | 6.1 | Pass | 0.09 | Pass | 18.6 | Pass | 0.8 | 2.9 | 1,400 |
| 31 | W | Co: 0.5% | 9.2 | Pass | 0.12 | Pass | 22.6 | Pass | 0.8 | 1.6 | 1,400 |
| 32 | W | Co: 1.0% | 6.7 | Pass | 0.11 | Pass | 14.7 | Pass | 0.8 | 2.0 | 1,400 |
| 33 | W | Fe: 0.5% | 19.8 | Pass | 0.14 | Pass | 42.2 | Pass | 0.8 | 1.2 | 1,400 |
| 34 | W | Ni: 0.25% | 9.7 | Pass | 0.15 | Pass | 19.6 | Pass | 1.1 | 1.2 | 1,400 |
| 35 | W | Ni: 0.5% | 7.9 | Pass | 0.16 | Pass | 13.7 | Pass | 1.4 | 1.9 | 1,400 |
| 36 | W | Ni: 10.0% | 3.0 | Pass | 0.08 | Pass | 10.8 | Pass | 0.8 | 5.5 | 1,400 |
| 37 | W | Ni: 11.0% | 2.8 | Pass | 0.08 | Fail | 8.8 | Fail | 0.8 | 6.0 | 1,400 |
| 38 | Mo | None | 30.0 | Fail | 0.20 | Pass | 48.1 | Fail | 1.5 | 1.5 | 1,400 |
| 39 | Mo | Ni: 0.1% | 19.8 | Pass | 0.15 | Pass | 47.1 | Pass | 1.5 | 1.6 | 1,400 |
| 40 | Mo | Ni: 1.0% | 19.1 | Pass | 0.15 | Pass | 46.1 | Pass | 1.5 | 2.8 | 1,400 |

In Table 2, for the resistivity, samples having a resistivity lower than those of samples without the second metal component were evaluated as “Pass”. For the adhesive strength, samples with the adhesive strength of 9.8 N or more were evaluated as “Pass”, and samples with the adhesive strength of less than 9.8 N were evaluated as “Fail”. For the comprehensive determination, a sample evaluated as “Fail” for at least any one of the two evaluation items described above was evaluated as “Fail”, and a sample not evaluated as “Fail” for any of the evaluation items was evaluated as “Pass”.

With reference to Table 2, W was used as the first metal component in the samples 26 to 37. In the sample 26, the area ratio of the glass phase was outside the range of 3% or more and 20% or less. Specifically, the area ratio of the glass phase exceeded 20%. As a result, the resistivity was 0.2 Ω·μm or higher. Thus, in terms of the electrical resistance, it was not considered that the sample 26 was preferred. From this result, it was confirmed that the absence of the second metal component caused the glass phase resulting from the sintering aid in the main body portion 10 to intrude from the main body portion 10 into the electroconductive portion 20 due to a capillary action and thus the electrical resistance value was insufficient.

Meanwhile, in the samples 27 to 36, the area ratio of the glass phase fell within the range of 3% or more and 20% or less. These samples were determined as “Pass” for both of the items corresponding to the resistivity and the adhesive strength, regardless of whether the second metal component was Ni, Fe, or Co. Thus, it is considered that preferred characteristics were obtained.

In the sample 37, the area ratio of the glass phase was outside the range of 3% or more and 20% or less. Specifically, the area ratio of the glass phase was less than 3%. As a result, the adhesive strength was less than 9.8 N (less than 1 kgf). In terms of the adhesive strength of the electroconductive portion 20 to the main body portion 10, it is not considered that the sample 37 was preferred. From the results described above, the following was confirmed. The formation of the glass phase 32 resulting from the sintering aid in the main body portion 10 contributed to an increase in adhesive strength of the electroconductive portion 20 to the main body portion 10. When the glass phase 32 was reduced to the area ratio at the extent of less than 3%, the adhesive strength was insufficient.

Further, in the samples 38 to 40, Mo was employed as the first metal component in place of W that was employed in the samples 26 to 37. From the above-mentioned results of the experiment, even when Mo was employed as the first metal component, the same trend as that observed when W was employed was confirmed.

From the above-mentioned results of the experiment, it was confirmed that, when the area ratio of the glass phase was 3% or more and 20% or less, excellent results were obtained for both of the resistivity and the adhesive strength. Further, it was confirmed that, when the area ratio of the glass phase was set to 8% or more and 20% or less, higher adhesive strength, specifically, adhesive strength of 19.6 N (2 kgf) or higher was obtained.

Further, it was confirmed that, when the average particle diameter of the metal particles in the electroconductive phase after baking was 1.2 μm or larger and 5.5 μm or smaller, excellent results were obtained for both of the resistivity and the adhesive strength. Further, it was confirmed that, when the average particle diameter of the metal particles in the electroconductive phase was set to 1.2 μm or larger and 1.6 μm or smaller, higher adhesive strength, specifically, adhesive strength of 19.6 N (2 kgf) or higher was obtained. A correlation was obtained between the average particle diameter of the metal particles in the electroconductive phase after sintering and the glass phase or the second metal component in such a manner that the average particle diameter was decreased as the ratio of the glass phase in the electroconductive portion 20 was increased and was increased as the ratio of the second metal component was increased. Further, the average particle diameter of the metal particles in the electroconductive phase after baking can be adjusted by changing a magnitude of the average particle diameter of the raw material powder before baking or blending the glass component into the components of the electroconductive portion before baking.

In the embodiments, the main body portion 10 including the side wall portion 12 has been described. The ceramic wiring member according to the present disclosure is not limited to that described above, and may include the main body portion 10 having a flat plate-like shape without the side wall portion 12. Such ceramic wiring member 1 is used as a ceramic wiring board on which an electronic component is to be mounted. Further, in view of a reduction in contact resistance or the like, a plating layer formed of a nickel (Ni) layer, a gold (Au) layer, or the like may be formed on surfaces of the internal terminals 21 and the external terminals 25.

It is to be understood that the embodiments and Examples disclosed herein are merely examples in all aspects and in no way intended to limit the present disclosure in any aspect. The scope of the present disclosure is defined by the appended claims and not by the above description, and it is intended that the present disclosure encompasses all modifications made within the scope and spirit equivalent to those of the appended claims.

REFERENCE SIGNS LIST

1 ceramic wiring member, 10 main body portion, 10A cavity, 11 bottom wall portion, 11A first principal surface, 11B second principal surface, 12 side wall portion, 12A first end surface, 12B second end surface, 20 electroconductive portion, 21 internal terminal, 22 first connecting portion, 23 internal wiring, 24 second connecting portion, 25 external terminal, 26 upper terminal, 27 third connecting portion, 28 lower terminal, 29 fourth connecting portion, 30 intermediate terminal, 31 electroconductive phase, 32 glass phase, 121 protruding portion, 121A second surface, 121B first surface, 121C third surface.

The invention claimed is:

1. A ceramic wiring member, comprising:

a main body portion made of ceramic;

an electroconductive portion arranged in contact with the main body portion, wherein the electroconductive portion has a composition including:

a first metal component corresponding to a main component, the first metal component being at least any one of W or Mo;

at least one second metal component selected from the group consisting of Ni, Co, and Fe at 0.1% or more and 10% or less in total to the first metal component; and a ceramic component, and wherein the electroconductive portion has a structure including:

an electroconductive phase made of an alloy of the first metal component and the second metal component; and a glass phase, which is dispersed in the electroconductive phase and is made of the ceramic component at 3% or more and 20% or less in area ratio on a cross section of the electroconductive portion.

2. The ceramic wiring member according to claim 1, wherein the area ratio of the glass phase on the cross section of the electroconductive portion is 8% or more and 20% or less.

3. The ceramic wiring member according to claim 2, wherein an average particle diameter of metal particles in the electroconductive phase is 1.2 μm or larger and 5.5 μm or smaller.

4. The ceramic wiring member according to claim 2, wherein the structure of the electroconductive portion is devoid of an intermetallic compound phase made of an intermetallic compound of the first metal component and the second metal component.

5. The ceramic wiring member according to claim 2, wherein the main body portion has a plate-shaped portion, and wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in a thickness direction of the plate-shaped portion.

6. The ceramic wiring member according to claim 1, wherein an average particle diameter of metal particles in the electroconductive phase is 1.2 μm or larger and 5.5 μm or smaller.

7. The ceramic wiring member according to claim 6, wherein an average particle diameter of the metal particles is 1.2 μm or larger and 1.6 μm or smaller.

8. The ceramic wiring member according to claim 7, wherein the structure of the electroconductive portion is devoid of an intermetallic compound phase made of an intermetallic compound of the first metal component and the second metal component.

9. The ceramic wiring member according to claim 7, wherein the main body portion has a plate-shaped portion, and wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in a thickness direction of the plate-shaped portion.

10. The ceramic wiring member according to claim 6, wherein the structure of the electroconductive portion is devoid of an intermetallic compound phase made of an intermetallic compound of the first metal component and the second metal component.

11. The ceramic wiring member according to claim 6, wherein the main body portion has a plate-shaped portion, and wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in a thickness direction of the plate-shaped portion.

12. The ceramic wiring member according to claim 1, wherein the structure of the electroconductive portion is devoid of an intermetallic compound phase made of an intermetallic compound of the first metal component and the second metal component.

13. The ceramic wiring member according to claim 12, wherein the main body portion has a plate-shaped portion, and wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in a thickness direction of the plate-shaped portion.

14. The ceramic wiring member according to claim 1, wherein the main body portion has a plate-shaped portion, and wherein the electroconductive portion includes:

a first portion being in contact with a first principal surface of the plate-shaped portion; and a second portion being in contact with a second principal surface of the plate-shaped portion, the second portion being positioned on a side opposite to the first principal surface in a thickness direction of the plate-shaped portion.

* * * * *